United States Patent
Yu et al.

(10) Patent No.: US 11,728,217 B2
(45) Date of Patent: *Aug. 15, 2023

(54) WAFER LEVEL PACKAGE STRUCTURE AND METHOD OF FORMING SAME

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Mirng-Ji Lii, Sinpu Township (TW); Chien-Hsun Lee, Chu-tung Town (TW); Jiun Yi Wu, Zhongli (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/379,775

(22) Filed: Jul. 19, 2021

(65) Prior Publication Data
US 2021/0351076 A1 Nov. 11, 2021

Related U.S. Application Data

(60) Continuation of application No. 15/871,604, filed on Jan. 15, 2018, now Pat. No. 11,069,573, which is a
(Continued)

(51) Int. Cl.
*H01L 25/00* (2006.01)
*H01L 25/065* (2023.01)
(Continued)

(52) U.S. Cl.
CPC ...... *H01L 21/76898* (2013.01); *H01L 21/568* (2013.01); *H01L 24/19* (2013.01);
(Continued)

(58) Field of Classification Search
CPC ................ H01L 25/50; H01L 25/0657; H01L 2224/48227; H01L 2224/73265;
(Continued)

(56) References Cited

U.S. PATENT DOCUMENTS 7,883,991 B1 2/2011 Wu et al.
8,669,140 B1 3/2014 Muniandy et al.
(Continued)

FOREIGN PATENT DOCUMENTS

CN 102931173 A 2/2013
KR 20120014952 A 2/2012
(Continued)

*Primary Examiner* — Thanh Y. Tran
(74) *Attorney, Agent, or Firm* — Slater Matsil, LLP

(57) ABSTRACT

An embodiment is a package including a first package component. The first package component including a first die attached to a first side of a first interconnect structure, a molding material surrounding the first die, and a second interconnect structure over the molding material and the first die, a first side of the second interconnect structure coupled to the first die with first electrical connectors. The first package component further includes a plurality of through molding vias (TMVs) extending through the molding material, the plurality of TMVs coupling the first interconnect structure to the second interconnect structure, and a second die attached to a second side of the second interconnect structure with second electrical connectors, the second side of the second interconnect structure being opposite the first side of the second interconnect structure.

20 Claims, 10 Drawing Sheets

Related U.S. Application Data division of application No. 14/144,913, filed on Dec. 31, 2013, now Pat. No. 9,870,946.

(51) Int. Cl.
| | |
|---|---|
| *H01L 21/768* | (2006.01) |
| *H01L 21/56* | (2006.01) |
| *H01L 23/00* | (2006.01) |
| *H01L 25/10* | (2006.01) |
| *H01L 23/31* | (2006.01) |
| *H01L 23/538* | (2006.01) |
| *H01L 23/498* | (2006.01) |

(52) U.S. Cl.
CPC ............ *H01L 25/105* (2013.01); *H01L 25/50* (2013.01); *H01L 23/3128* (2013.01); *H01L 23/49811* (2013.01); *H01L 23/5389* (2013.01); *H01L 24/73* (2013.01); *H01L 25/0657* (2013.01); *H01L 2224/12105* (2013.01); *H01L 2224/13147* (2013.01); *H01L 2224/13155* (2013.01); *H01L 2224/16145* (2013.01); *H01L 2224/16225* (2013.01); *H01L 2224/19* (2013.01); *H01L 2224/32145* (2013.01); *H01L 2224/32225* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2224/81005* (2013.01); *H01L 2224/81192* (2013.01); *H01L 2224/83005* (2013.01); *H01L 2224/92125* (2013.01); *H01L 2224/92244* (2013.01); *H01L 2225/0651* (2013.01); *H01L 2225/06562* (2013.01); *H01L 2225/1023* (2013.01); *H01L 2225/1035* (2013.01); *H01L 2225/1041* (2013.01); *H01L 2225/1058* (2013.01); *H01L 2924/00* (2013.01); *H01L 2924/12042* (2013.01); *H01L 2924/1431* (2013.01); *H01L 2924/1434* (2013.01); *H01L 2924/15311* (2013.01); *H01L 2924/15331* (2013.01); *H01L 2924/181* (2013.01)

(58) Field of Classification Search
CPC ........... H01L 24/19; H01L 2924/15311; H01L 2924/181; H01L 21/568; H01L 23/3128; H01L 23/49811; H01L 23/5389; H01L 2224/12105; H01L 2224/16145; H01L 2224/73204; H01L 2224/81005; H01L 2224/83005; H01L 2224/92244; H01L 2225/1035; H01L 2225/1058; H01L 2924/1431; H01L 2924/1434

See application file for complete search history.

(56) References Cited

U.S. PATENT DOCUMENTS

| | | | |
|---|---|---|---|
| 8,754,514 | B2 | 6/2014 | Yu et al. |
| 8,980,111 | B2 | 3/2015 | Ko et al. |
| 9,870,946 | B2* | 1/2018 | Yu ............................ H01L 25/50 |
| 10,049,964 | B2* | 8/2018 | Shim, II ................ H01L 21/561 |
| 11,069,573 | B2* | 7/2021 | Yu ........................... H01L 21/568 |
| 2006/0087044 | A1 | 4/2006 | Goller |
| 2007/0181989 | A1* | 8/2007 | Corisis .................... H01L 21/56 438/109 |
| 2008/0073742 | A1 | 3/2008 | Adkisson et al. |
| 2008/0308950 | A1 | 12/2008 | Yoo et al. |
| 2010/0327439 | A1 | 12/2010 | Hwang et al. |
| 2011/0242427 | A1 | 10/2011 | Ramsdale |
| 2011/0256664 | A1 | 10/2011 | Pagaila et al. |
| 2012/0018885 | A1 | 1/2012 | Lee et al. |
| 2012/0038044 | A1 | 2/2012 | Chang et al. |
| 2012/0112355 | A1 | 5/2012 | Pagaila et al. |
| 2013/0069224 | A1 | 3/2013 | Kim et al. |
| 2013/0069239 | A1 | 3/2013 | Kim et al. |
| 2013/0093097 | A1 | 4/2013 | Yu et al. |
| 2013/0140683 | A1 | 6/2013 | Pagaila |
| 2013/0228917 | A1 | 9/2013 | Yoon et al. |
| 2013/0309813 | A1 | 11/2013 | Shih et al. |
| 2014/0035892 | A1 | 2/2014 | Shenoy et al. |
| 2014/0070422 | A1 | 3/2014 | Hsiao et al. |
| 2014/0091471 | A1 | 4/2014 | Chen et al. |
| 2014/0110840 | A1 | 4/2014 | Wojnowski et al. |
| 2014/0110841 | A1 | 4/2014 | Beer et al. |
| 2014/0217604 | A1 | 8/2014 | Chou et al. |
| 2014/0246788 | A1 | 9/2014 | Kim et al. |
| 2015/0091118 | A1 | 4/2015 | Sato et al. |
| 2015/0132888 | A1 | 5/2015 | Colosimo, Jr. et al. |
| 2015/0171006 | A1 | 6/2015 | Hung et al. |

FOREIGN PATENT DOCUMENTS

| | | |
|---|---|---|
| KR | 101128063 B1 | 4/2012 |
| KR | 20130018090 A | 2/2013 |
| WO | 2012151002 A1 | 11/2012 |

\* cited by examiner

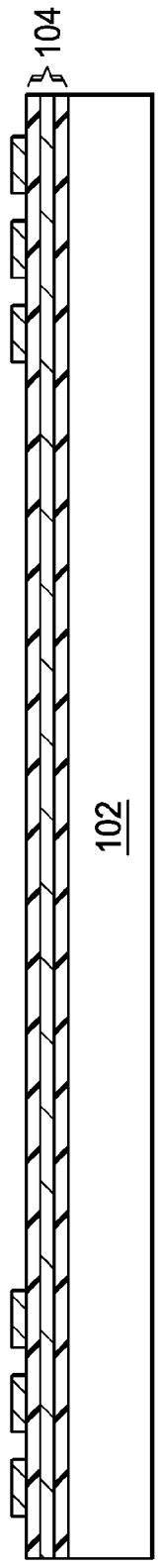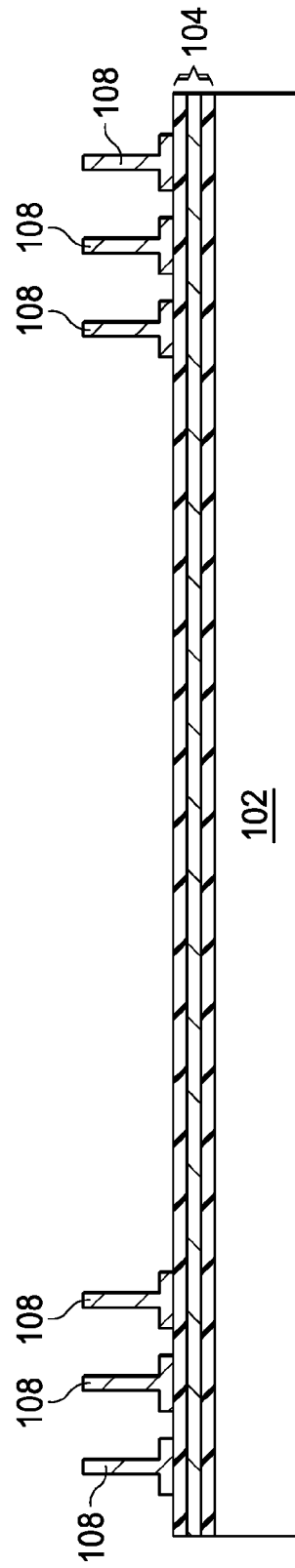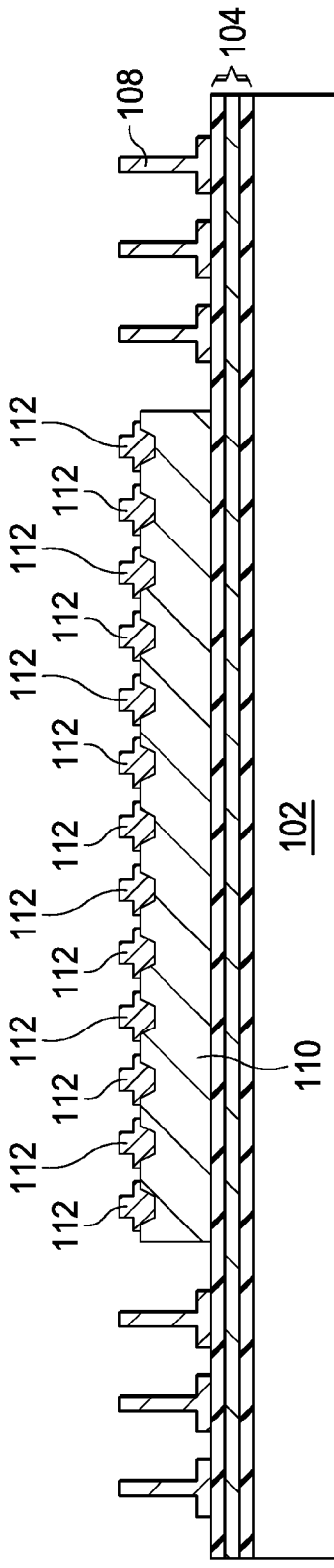

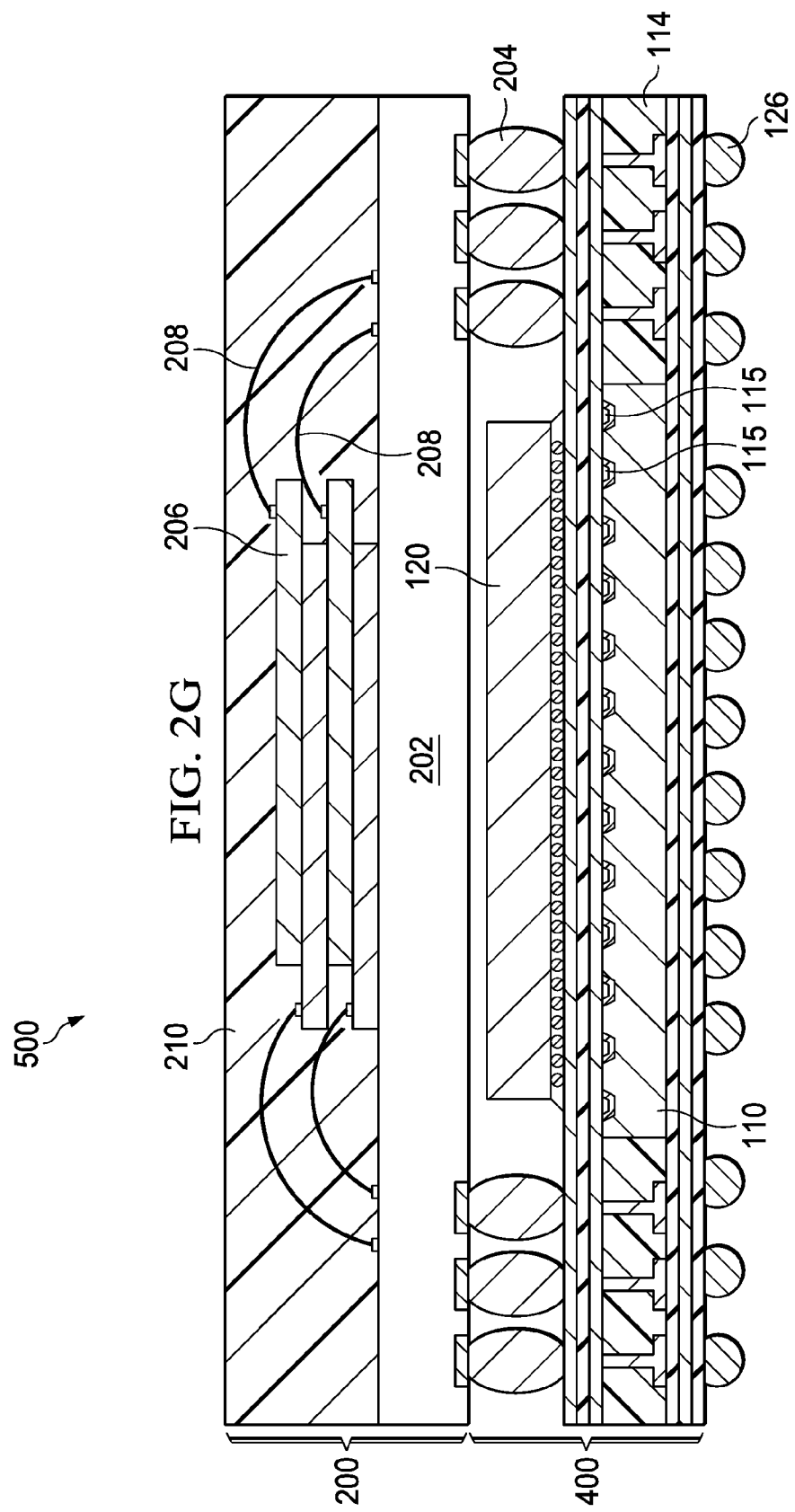

WAFER LEVEL PACKAGE STRUCTURE AND METHOD OF FORMING SAME

PRIORITY CLAIM AND CROSS-REFERENCE

This application is a continuation of U.S. application Ser. No. 15/871,604, filed on Jan. 15, 2018, and entitled "Wafer Level Package Structure and Method of Forming Same," which is a division of U.S. application Ser. No. 14/144,913, filed on Dec. 31, 2013, and entitled "Wafer Level Package Structure and Method of Forming Same," now U.S. Pat. No. 9,870,946, issued on Jan. 16, 2018 which applications are incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also, in some instances, require smaller packages that utilize less area than packages of the past.

Package on package (PoP) technology is becoming increasingly popular for its ability to allow denser integration of integrated circuits into a small overall package. PoP technology is employed in many advanced handheld devices, such as smart phones. While PoP technology has allowed for a lower package profile, the total thickness reduction is currently limited by the solder ball joint height and the distance between adjacent joints, referred to as the pitch. Dies are sometimes mounted to an interposer substrate or other packaging carrier using a conductive mounting structure such as a ball grid array, land grid array, pin array, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1J illustrate cross-sectional views of intermediate steps in forming a wafer level package (WLP) in accordance with some embodiments.

FIGS. 2A through 2G illustrate cross-sectional views of intermediate steps in forming a WLP in accordance with some embodiments.

DETAILED DESCRIPTION

Figure 1D:
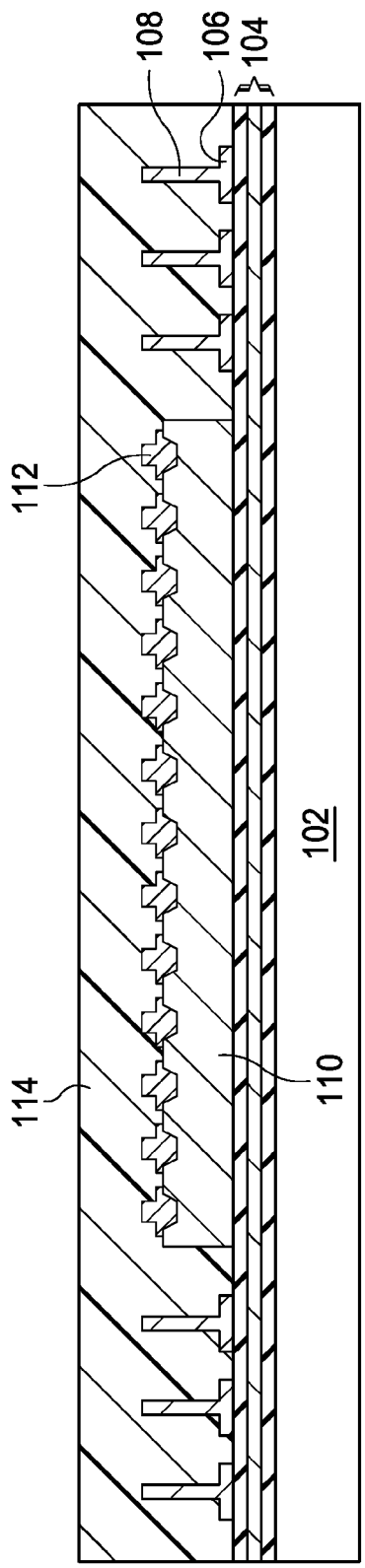

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely making and using wafer level package (WLP) assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

Figure 3:
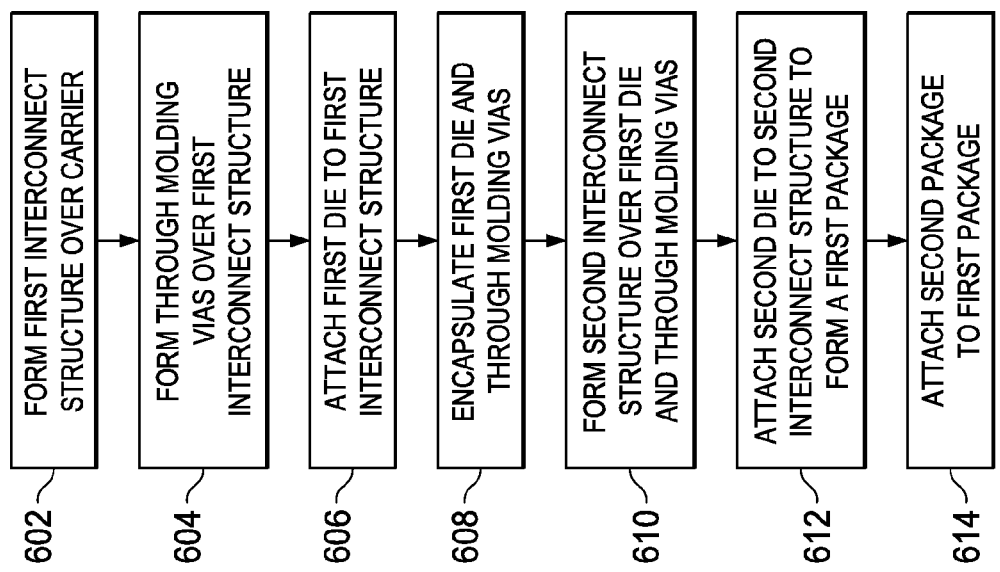
FIG. 3 is a flow diagram illustrating a method of forming a WLP in accordance with some embodiments.

FIGS. 1A through 1J illustrate cross-sectional views in an example process in forming a WLP assembly, and FIG. 3 illustrates a flow chart of this example process.

FIG. 1A illustrates forming an interconnect structure 104 over a carrier substrate 102 (step 602). The carrier substrate 102 may provide temporary mechanical and structural support during the subsequent processing steps. The interconnect structure 104 comprising one or more dielectric layer(s) and respective metallization pattern(s) is formed over a surface of the carrier substrate 102. The metallization pattern(s) in the dielectric layer(s) may route electrical signals between the devices, such as by using vias and/or traces, and may also contain various electrical devices, such as capacitors, resistors, inductors, or the like. The metallization patterns are sometimes referred to as Redistribution Lines (RDL). The various devices and metallization patterns may be interconnected to perform one or more functions. The functions may include memory structures, processing structures, sensors, amplifiers, power distribution, input/output circuitry, or the like. Additionally, bond pads are formed in and/or on the interconnect structure 104 to provide an external electrical connection to the circuitry and/or devices. One of ordinary skill in the art will appreciate that the above examples are provided for illustrative purposes. Other circuitry may be used as appropriate for a given application.

More particularly, one or more inter-metallization dielectric (IMD) layers may be formed in the interconnect structure 104. The IMD layer(s) may be formed, for example, of a low-K dielectric material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. In some embodiments, the openings or recesses are formed by laser patterning. The recesses and/or openings may be lined with a diffusion barrier layer and filled with a conductive material. The diffusion barrier layer may include one or more layers of TaN, Ta, TiN, Ti, CoW, or the like, deposited by atomic layer deposition (ALD), or the like, and the conductive material may be made of copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

FIG. 1B illustrates forming electrical connectors 108 over a first side of the interconnect structure 104 (step 604). The electrical connectors 108 may be stud bumps, which are formed by wire bonding on the bond pads of interconnect structure 104, and cutting the bond wire with a portion of bond wire left attached to the respective bond ball. For example, in FIG. 1B, the electrical connectors 108 include a lower portion and an upper portion, wherein the lower portion may be a bond ball formed in the wire bonding, and the upper portion may be the remaining bond wire. The upper portion of the electrical connector 108 may have a uniform width and a uniform shape that are uniform throughout the top part, the middle part, and the bottom part of upper portion. The electrical connectors 108 are formed of non-solder metallic materials that can be bonded by a wire bonder. In some embodiments, the electrical connectors 108 are made of copper wire, gold wire, the like, or a combination thereof, and may have a composite structure including a plurality of layers.

In alternative embodiments, the electrical connectors 108 are formed through electrical plating. In these embodiments, the electrical connectors 108 are made of copper, aluminum, nickel, gold, silver, palladium, the like, or a combination thereof, and may have a composite structure including a plurality of layers. In these embodiments, a sacrificial layer (not shown) is formed over the interconnect structure 104. A plurality of openings is formed in the sacrificial layer to expose the underlying bond pads in the interconnect structure 104. A plating step is then performed to plate the electrical connectors 108. After the formation of the electrical connectors 108, the sacrificial layer is then removed.

FIG. 1C illustrates attaching a first die 110 over the interconnect structure 104 (step 606) with the backside surface of the first die 110 adjoining the interconnect structure 104. The first die 110 may be a logic die, such as a central processing unit (CPU), a graphics processing unit (GPU), the like, or a combination thereof. In some embodiments, the first die 110 includes a die stack (not shown) which may include both logic dies and memory dies.

Electrical connectors 112 are formed on an active surface of the first die 110, the active surface being opposite the backside surface. The electrical connectors 112 allow the first die 110 to be coupled to a subsequently formed interconnect structure 116 (see FIG. 1F). In some embodiments, the electrical connectors 112 are solder balls and/or bumps, such as controlled collapse chip connection (C4). In other embodiments, the electrical connectors 112 are metal pillars, wherein solder caps are formed on the top surfaces of the metal pillars. In yet other embodiments, the electrical connectors 112 are composite bumps comprising copper posts, nickel layers, solder caps, Electroless Nickel Immersion Gold (ENIG), Electroless Nickel Electroless Palladium Immersion Gold (ENEPIG), and/or the like.

FIG. 1D illustrates encapsulating the first die 110 and the electrical connectors 108 and 112 (step 608). In some embodiments, the first die 110 and the electrical connectors 108 and 112 are encapsulated by a molding material 114. The molding material 114 may be molded on the first die 110 and the electrical connectors 108 and 112, for example, using compression molding. In some embodiments, the molding material 114 is made of a molding compound, a polymer, an epoxy, silicon oxide filler material, the like, or a combination thereof. A curing step may be performed to cure the molding material 114, wherein the curing may be a thermal curing, a Ultra-Violet (UV) curing, or the like.

Figure 1E:
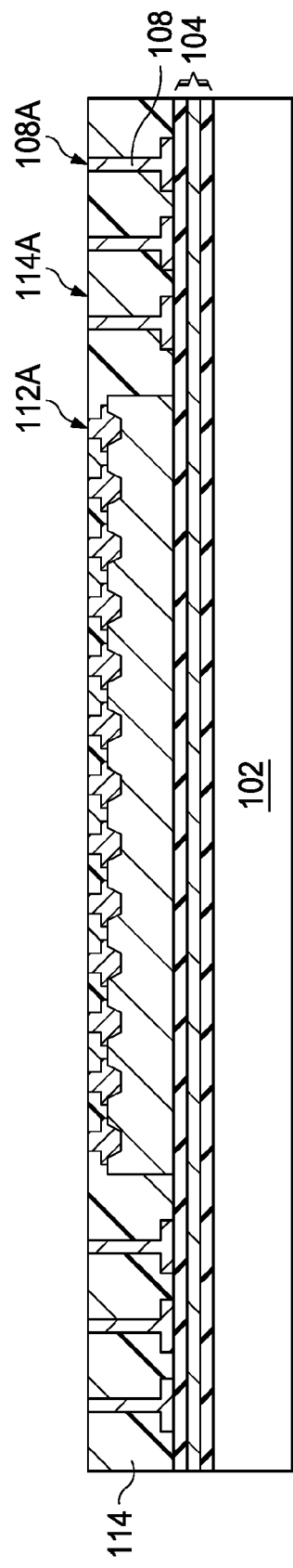

In some embodiments, the first die 110 and the electrical connectors 108 and 112 are buried in the molding material 114, and after the curing of the molding material 114, a planarization step, such as a grinding, is performed to remove excess portions of the molding material 114, which excess portions are over top surfaces of the electrical connectors 108 and 112 as illustrated in FIG. 1E. In some embodiments, top surfaces 112A of the electrical connectors 112 and top surfaces 108A of the electrical connectors 108 are exposed, and are level with a top surface 114A of the molding material 114. The electrical connectors 108 may be referred to as through molding vias (TMVs) and will be referred to as TMVs 108 hereinafter.

Figure 1F:
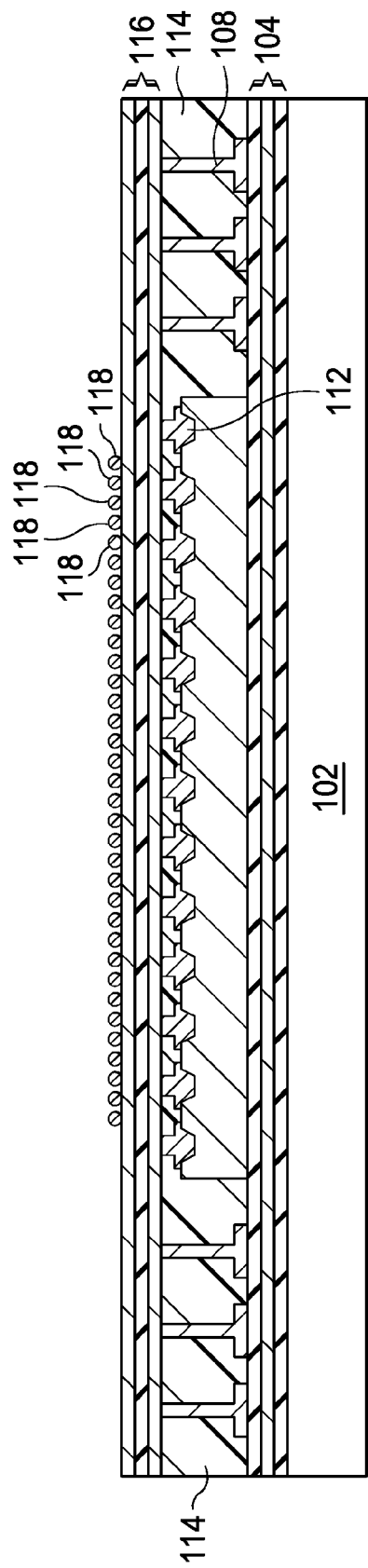

FIG. 1F illustrates forming an interconnect structure 116 over the first die 110, the TMVs 108, and the electrical connectors 112 (step 610) and forming electrical connectors 118 over the interconnect structure 116. The interconnect structure 116 comprising one or more dielectric layer(s) and respective metallization pattern(s) is formed over the top surface 114A of the molding material 114 and a first side of the interconnect structure is directly coupled to the electrical connectors 112 and the TMVs 108.

The metallization pattern(s) in the dielectric layer(s) may route electrical signals between the electrical connectors 112 and the TMVs 108, such as by using vias and/or traces, and may also contain various electrical devices, such as capacitors, resistors, inductors, or the like. The metallization patterns may also be referred to RDLs. The various devices and metallization patterns may be interconnected to perform one or more functions. The functions may include memory structures, processing structures, sensors, amplifiers, power distribution, input/output circuitry, or the like. Additionally, bond pads are formed in and/or on the interconnect structure 116 to provide an external electrical connection to the circuitry and/or devices. One of ordinary skill in the art will appreciate that the above examples are provided for illustrative purposes. Other circuitry may be used as appropriate for a given application.

More particularly, one or more IMD layers may be formed in the interconnect structure 116. The IMD layer(s) may be formed, for example, of a low-K dielectric material, such as PSG, BPSG, FSG, SiOxCy, Spin-On-Glass, Spin-On-Polymers, silicon carbon material, compounds thereof, composites thereof, combinations thereof, or the like, by any suitable method known in the art, such as spinning, CVD, PECVD, HDP-CVD, or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. In some embodiments, the openings or recesses are formed by laser patterning. The recesses and/or openings may be lined with a diffusion barrier layer and filled with a conductive material. The diffusion barrier layer may include one or more layers of TaN, Ta, TiN, Ti, CoW, or the like, deposited by ALD, or the like, and the conductive material may be made of copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a CMP.

Electrical connectors 118 are formed over and coupled to a second side of the interconnect structure 116, the second side of the interconnect structure 116 being opposite the first side of the interconnect structure 116. The electrical connectors 118 allow a second die 120 (see FIG. 1G) to be attached and coupled to the interconnect structure 116. In some embodiments, the electrical connectors 118 are microbumps, C4 bumps, solder balls, or the like. In other embodiments, the electrical connectors 118 are metal pillars, wherein solder caps are formed on the top surfaces of the metal pillars. In yet other embodiments, the electrical connectors 118 are composite bumps comprising copper posts, nickel layers, solder caps, Electroless Nickel Immersion Gold (ENIG), Electroless Nickel Electroless Palladium Immersion Gold (ENEPIG), and/or the like.

Figure 1G:
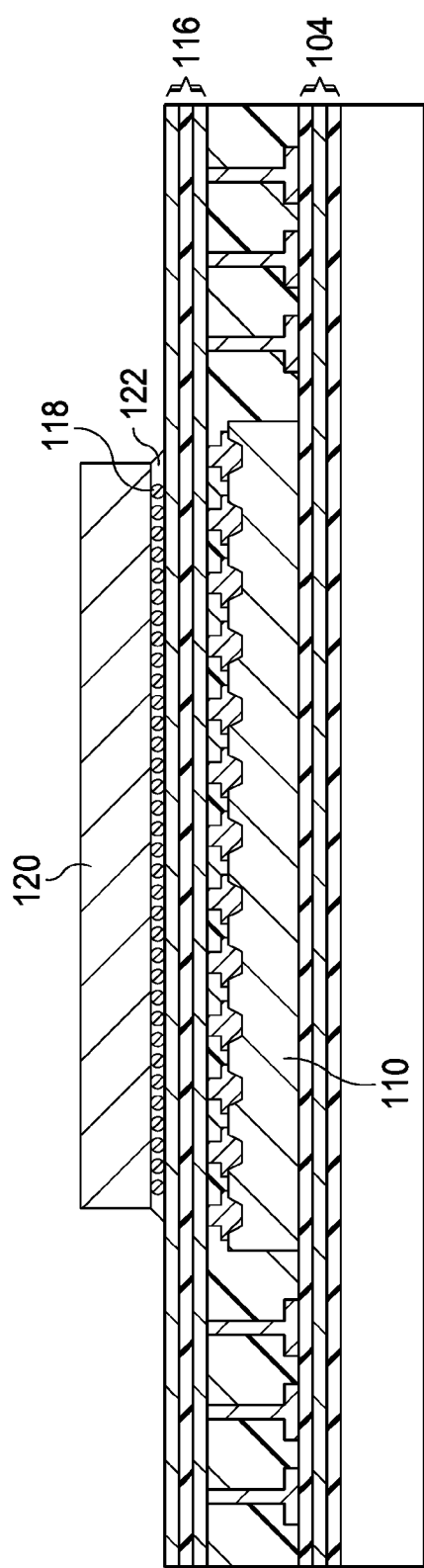

FIG. 1G illustrates attaching a second die 120 over the interconnect structure 116 (step 612) using the electrical connectors 118. The second die 120 may be a wide input/output (I/O) die that provides a connection between the first die 110 and the subsequently attached second package 200 (see FIG. 1J). In some embodiments, the first die 110 and the second die 120 do not contain any through vias. In an embodiment, the second die is a die stack and may include a wide I/O die and one or more memory dies.

Figure 1H:
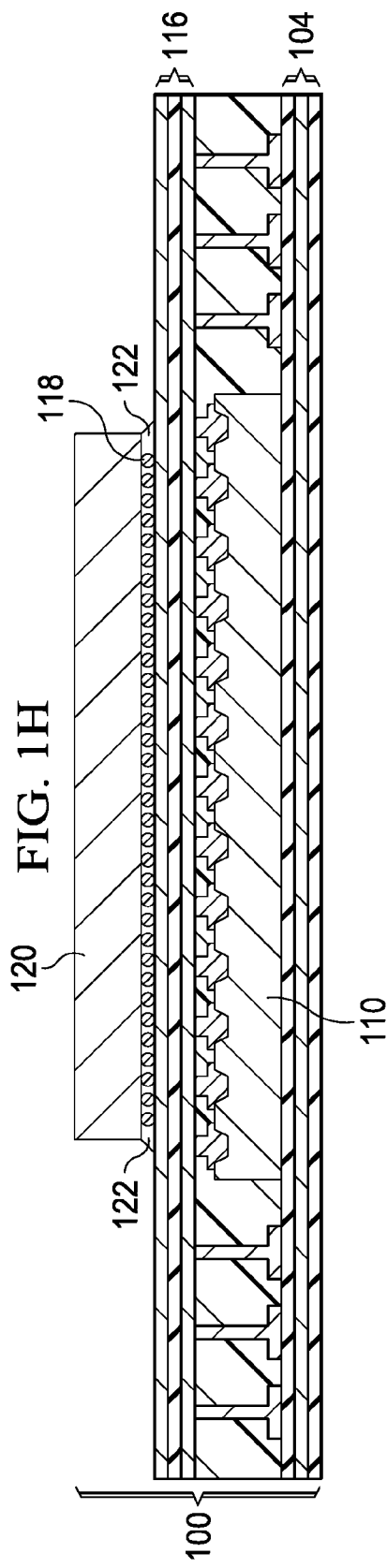

FIG. 1H illustrates removing the carrier substrate 102 from a second side of the interconnect structure 104, the second side of the interconnect structure 104 being opposite the first side of the interconnect structure 104. The interconnect structures 104 and 116, the TMVs 108, the first die 110, and the second die 120 form a first package 100. In an embodiment, the first package 100 includes a logic die 110 and a wide I/O die 120 and may be further attached to a second package (see FIG. 1J), which includes one or more memory dies. The wide I/O die 120 allows the logic die 110 to access the memory dies in the second package with minimal routing between the logic die 110 and the wide I/O die 120 which may increase the speed and reduce the power requirements of the semiconductor device.

Figure 1I:
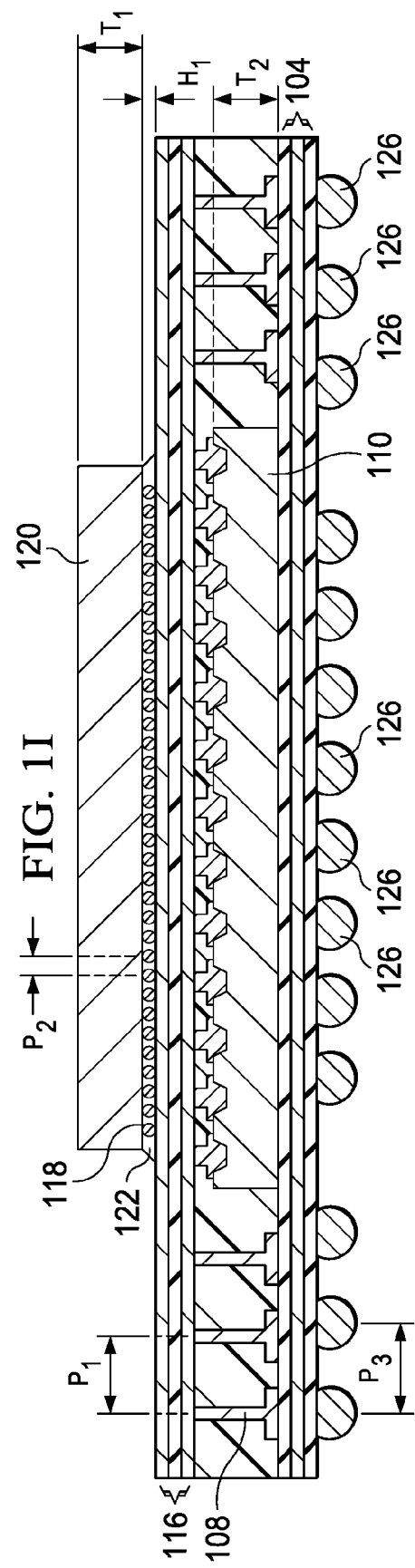

FIG. 1I illustrates forming electrical connectors 126 on the second side of the interconnect structure 104 which are electrically coupled to the interconnect structure 104. In some embodiments, the electrical connectors 126 are solder balls. In other embodiments, electrical connectors 126 may include metal pads, metal bumps, solder caps, or the like.

The electrical connectors 126 may be used to bond the first package 100 to an additional electrical component, which may be a semiconductor substrate, a package substrate, a Printed Circuit Board (PCB), or the like.

As illustrated in FIG. 1I, the TMVs 108 have a pitch $P_1$, the electrical connectors 118 have a pitch $P_2$, and the electrical connectors 126 have a pitch $P_3$. In some embodiments, the pitch $P_1$ is from about 100 μm to about 500 μm, the pitch $P_2$ is from about 30 μm to about 100 μm, and the pitch $P_3$ is from about 250 μm to about 500 μm. The second die 120 may have a thickness $T_1$, the first die 110 may have a thickness $T_2$, and the electrical connectors 118 may have a standoff height Hi from the second side of the interconnect structure 116 to the active surface of the second die 120. In some embodiments, the thickness $T_1$ is from about 40 μm to about 300 μm, the thickness $T_2$ is from about 40 μm to about 300 μm, and the height Hi is from about 30 μm to about 100 μm.

Figure 1J:
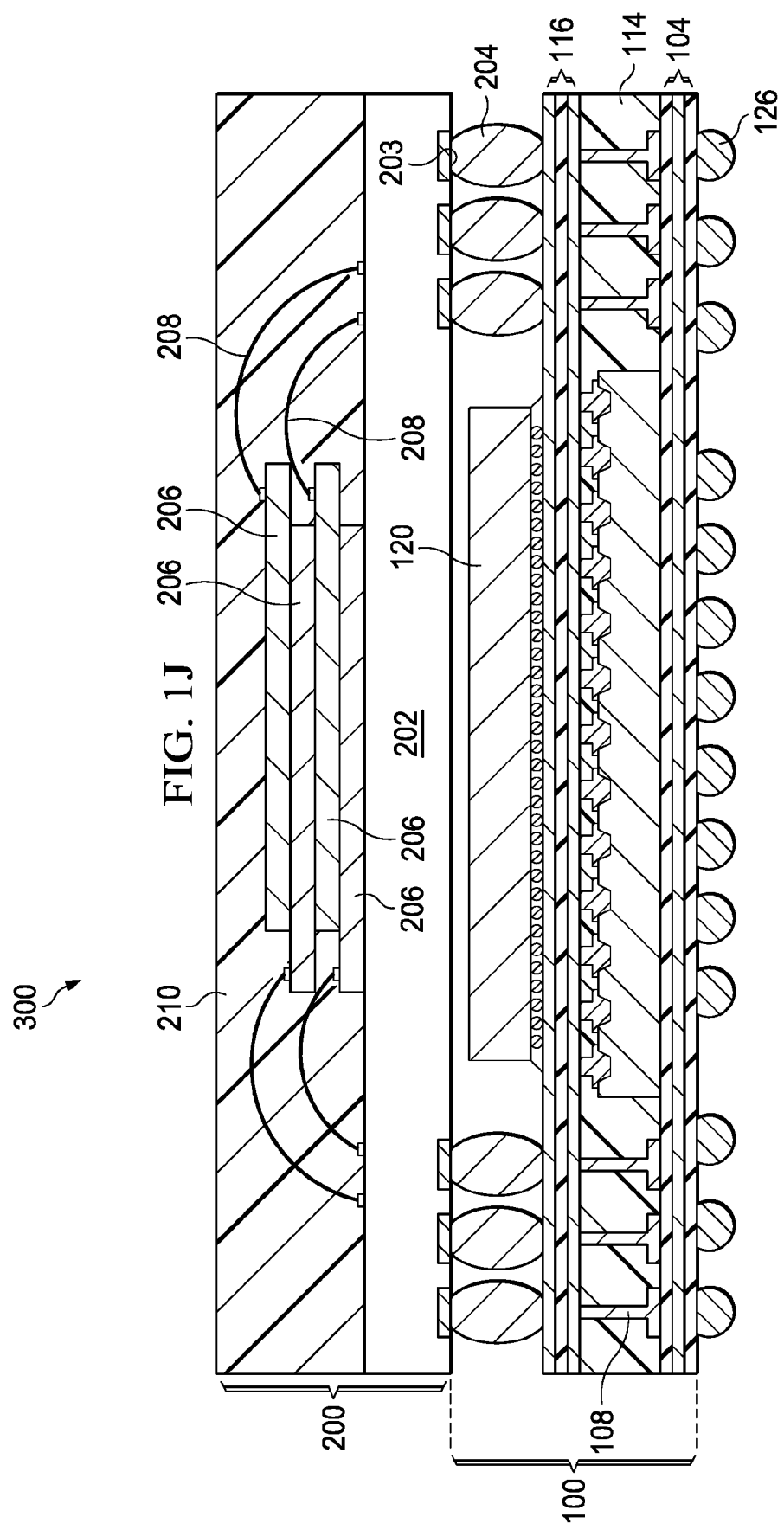

FIG. 1J illustrates attaching a second package 200 to the second side of the interconnect structure 116 of the first package 100 using electrical connectors 204 to form a semiconductor device 300. The second package 200 includes a substrate 202 and one or more stacked dies 206 coupled to the substrate 202.

The substrate 202 may have bond areas 203 on a first side the substrate 202 to couple to the electrical connectors 204. In addition, the substrate 202 may have bond areas (not shown) on a second side of the substrate 202, the second side being opposite the first side of the substrate 202, to couple to the stacked dies 206. In an embodiment, the substrate 202 is a silicon substrate, a silicon or glass interposer, a PCB, an organic laminate substrate, or the like. The substrate 202 may include electronic components and elements formed thereon in some embodiments, or alternatively, the substrate 202 may be free of electronic components and elements.

In the illustrated embodiment, the stacked dies 206 are coupled to the substrate 202 by wire bonds 208, although other connections may be used, such as contact bumps. In an embodiment, the stacked dies 206 are stacked memory dies 206. For example, the stacked memory dies 206 may include low-power (LP) double data rate (DDR) memory modules, such as LPDDR1, LPDDR2, LPDDR3, or the like memory modules. The stacked memory dies 206 may be coupled to the first package 100 through the electrical connectors 204 and the wire bonds 208.

In some embodiments, the stacked dies 206 and the wire bonds 208 may be encapsulated by a molding material 210. The molding material 210 may be molded on the stacked dies 206 and the wire bonds 208, for example, using compression molding. In some embodiments, the molding material 210 is a molding compound, a polymer, an epoxy, the like, or a combination thereof. A curing step may be performed to cure the molding material 210, wherein the curing may be a thermal curing, a UV curing, or the like.

In some embodiments, the stacked dies 206 and the wire bonds 208 are buried in the molding material 210, and after the curing of the molding material 210, a planarization step, such as a grinding, is performed to remove excess portions of the molding material 210 and provide a substantially planar surface for the second package 200.

The electrical connectors 204 may be formed by forming solder balls on one or both of the second side of the interconnect structure 116 and the bond areas 203 of the substrate 202. The first package 100 and the second package 200 may be brought together until the substrate 202 and the interconnect structure 116 are coupled by the solder balls and the solder balls are reflowed to form the electrical connectors 204. The electrical connectors 204 may be referred to as solder joints 204. In some embodiments, the electrical connectors have a substantially barrel shape in the cross-sectional view.

FIGS. 2A through 2G illustrate cross-sectional views in another example process in forming a WLP assembly. Details regarding this embodiment that are similar to those for the previously described embodiment are not repeated herein.

Figure 2A:
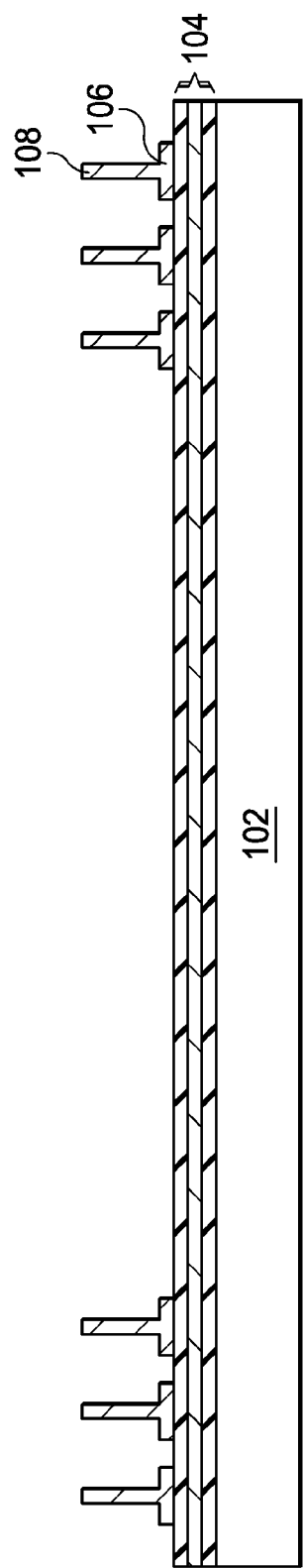

FIG. 2A illustrates the carrier substrate 102 with the interconnect structure 104 and the electrical connectors 108 over the carrier substrate 102. The intermediate structure in FIG. 2A is similar to the structure described above in FIG. 1B and the description is not repeated herein.

Figure 2B:
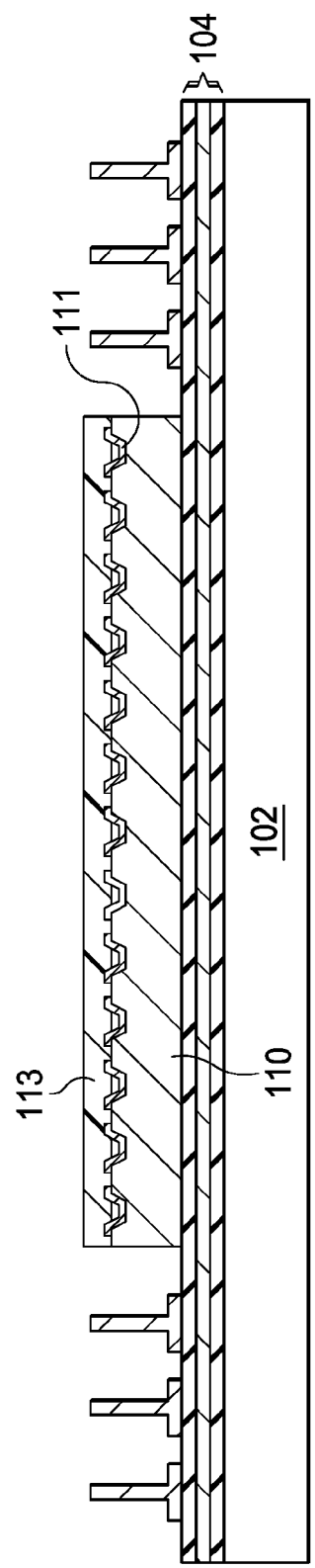

FIG. 2B illustrates attaching the first die 110 over the interconnect structure 104 with the backside surface of the first die 110 adjoining the interconnect structure 104. This step is similar to the step described above in FIG. 1C except instead of the electrical connectors 112 over the first die 110, the first die 110 in FIG. 2B includes UBMs 111 over the active surface of the first die 110 and a release film 113 over the UBMs 111 and the active surface of the first die 110.

The UBMs 111 may include one or more layers of conductive material. There are many arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 111. A photo resist (not shown) may be formed and patterned, so that some portions of the active surface of the first die 110 are exposed, and some other portions are covered. A plating process may be performed to plate the materials and layers on the exposed portions of the active surface of the first die 110 to form the UBMs 111. Any suitable materials or layers of material that may be used for the UBMs 111 are fully intended to be included within the scope of the current application. After the plating process, the photo resist may be removed. In some embodiments, the UBMs 111 may be contact pads 111.

After the formation of the UBMs 111, the release film 113 is applied over the UBMs 111 and the active surface of the first die 110 to prevent the subsequently formed molding material 114 from adhering to the UBMs 111 and the active surface of the first die 110. In an embodiment, the release film 113 is made of ethylene tetrafluoroethylene (ETFE), polytetrafluoroethylene (PTFE), the like, or a combination thereof.

Figure 2C:
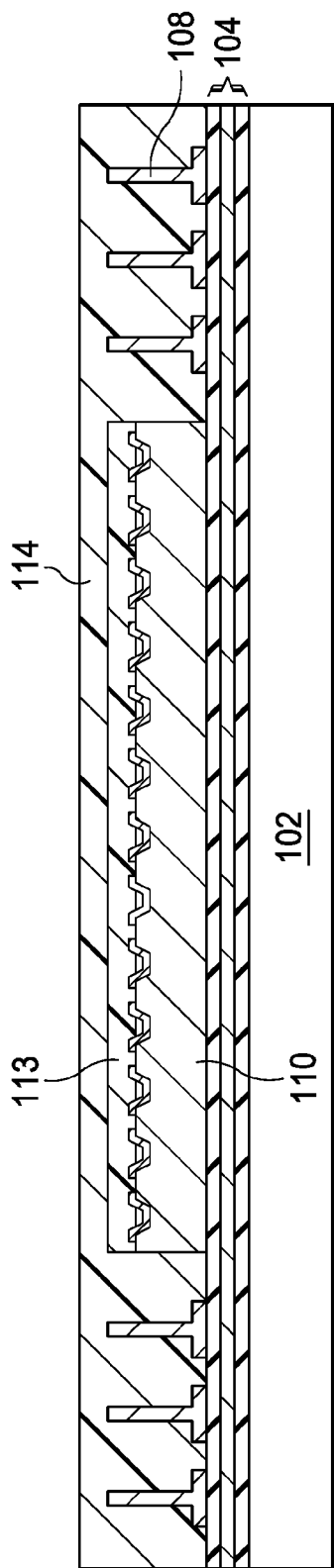

FIG. 2C illustrates encapsulating the first die 110, the release film 113, and the TMVs 108 with the molding material 114. The molding material 114 may be molded on the first die 110, the release film 113, and the TMVs 108, for example, using compression molding. In some embodiments, the molding material 114 is a molding compound, a polymer, an epoxy, the like, or a combination thereof. A curing step may be performed to cure the molding material 114, wherein the curing may be a thermal curing, a UV curing, or the like.

Figure 2D:
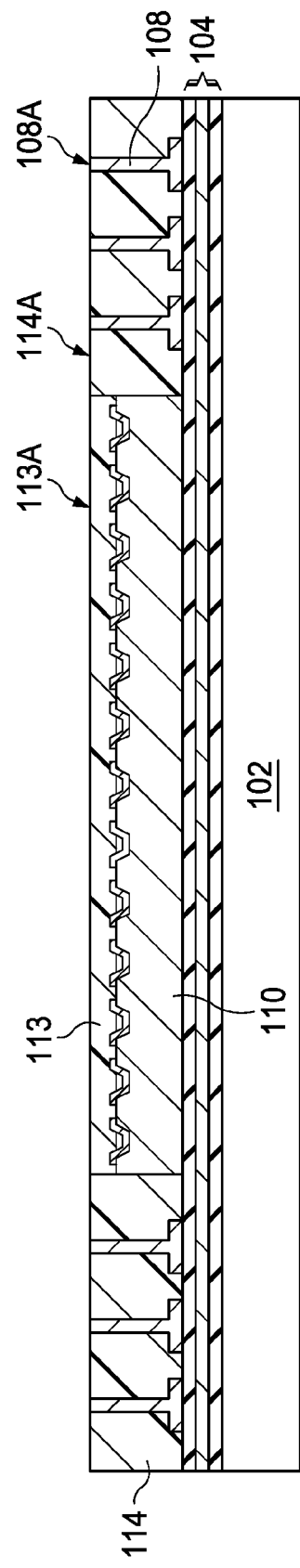

In some embodiments, the first die 110, the release film 113, and the TMVs 108 are buried in the molding material 114, and after the curing of the molding material 114, a planarization step, such as a grinding, is performed to remove excess portions of the molding material 114, which excess portions are over top surfaces of the release film 113 and the TMVs 108 as illustrated in FIG. 2D. In some embodiments, a top surface 113A of the release film 113 and top surfaces 108A of the TMVs 108 are exposed, and are level with the top surface 114A of the molding material 114.

Figure 2E:
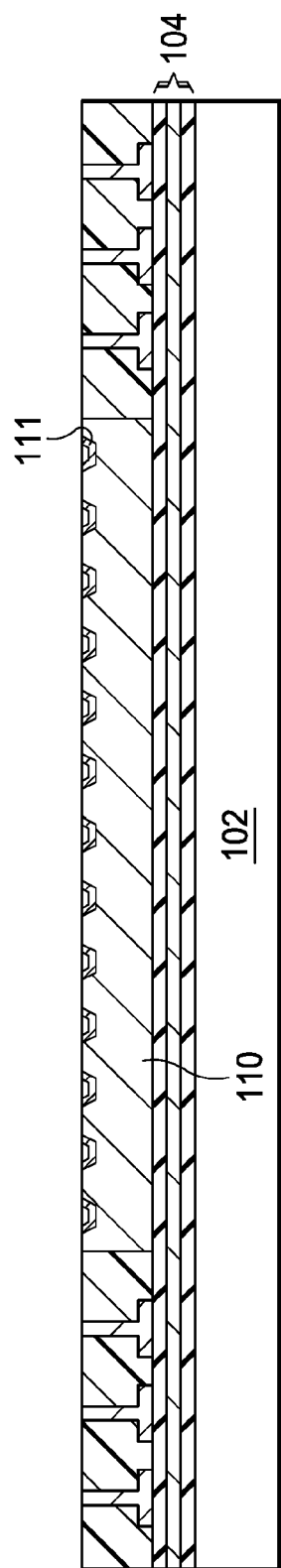
Figure 2F:
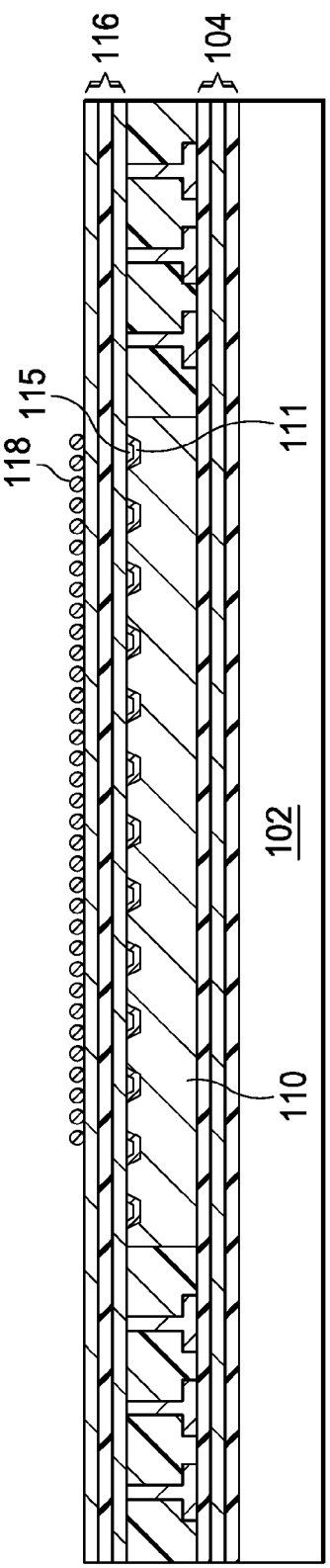

FIG. 2E illustrates removing the release film 113 to expose the UBMs 111 and the active surface of the first die 110. FIG. 2F illustrates forming electrical connectors 115 over and coupled to the UBMs 111, forming the interconnect structure 116 over and coupled to the electrical connectors 115 and the TMVs 108, and forming the electrical connectors 118 over the interconnect structure 116. In an embodiment, the electrical connectors 115 are solder balls and/or bumps, such as C4 bumps. In other embodiments, the electrical connectors 115 are metal pillars, wherein solder caps are formed on the top surfaces of the metal pillars. In yet other embodiments, the electrical connectors 115 are composite bumps comprising copper posts, nickel layers, solder caps, ENIG, ENEPIG, and/or the like. The interconnect structure 116 and the electrical connectors 118 are similar to the interconnect structure 116 and the electrical connectors 118 described above in FIG. 1F and the descriptions are not repeated herein.

FIG. 2G illustrates a semiconductor device 500 including the first package 100 and the second package 200 after several processing steps. The semiconductor device 500 is similar to the semiconductor device 300 described above in FIG. 1J except that the electrical connectors 115 in the semiconductor device 500 replaced the electrical connectors 112 in the semiconductor device 300, and the description of the other components in semiconductor device 500 are not repeated herein.

By having the TMVs 108 and the fan-out structures of the interconnect structures 104 and the 116 interconnecting the first die 110 and the second die 120, the first die 110 and the second die 120 are able to be free of any through vias. This allows the semiconductor device 300 to be more cost effective and have simplified processing. In addition, many variations of the second package 200 (e.g. various types and capacities of memory) can be used with little to no change in the first package 100 because both the logic and the wide I/O dies are in the first package 100. Further, because the wide I/O die 120 and the logic die 110 are interconnected with minimal routing, the speed of the semiconductor device may be increased while also reducing the power requirements and the overall thickness of the semiconductor device.

An embodiment is a method including attaching a backside surface of a first die to a first side of a first interconnect structure, forming a first through via over the first side of the first interconnect structure, the first through via being coupled to the first interconnect structure, and forming first electrical connectors on an active surface of the first die, the active surface being opposite the backside surface. The method further includes encapsulating the first die and the first through via with a molding material, forming a second interconnect structure over the molding material, the first electrical connectors and the first through via, the first electrical connectors and the first through via being coupled to a first side of the second interconnect structure, and attaching a second die to a second side of the second interconnect structure using second electrical connectors, the second side of the second interconnect structure being opposite the first side of the second interconnect structure.

Another embodiment is a method including forming a first package. The forming the first package including attaching a first die to a first interconnect structure, forming a first set of electrical connectors on an active surface of the first die, forming a plurality of through vias adjacent the first die, each of the plurality of through vias having a first end adjoining the first interconnect structure and a second end extending in a direction away from the first interconnect structure, and encapsulating the first die and the plurality of through vias with a molding material. The method further including planarizing the molding material to expose top surfaces of the first set of electrical connectors and second ends of the plurality of through vias, forming a second interconnect structure over the molding material, the first set of electrical connectors, and the plurality of through vias, the second interconnect structure being coupled to the first set of electrical connectors and the plurality of through vias, and attaching a second die to the second interconnect structure using a second set of electrical connectors.

A further embodiment is a package including a first package component. The first package component including a first die attached to a first side of a first interconnect structure, a molding material surrounding the first die, and a second interconnect structure over the molding material and the first die, a first side of the second interconnect structure coupled to the first die with first electrical connectors. The first package component further includes a plurality of through molding vias (TMVs) extending through the molding material, the plurality of TMVs coupling the first interconnect structure to the second interconnect structure, and a second die attached to a second side of the second interconnect structure with second electrical connectors, the second side of the second interconnect structure being opposite the first side of the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first redistribution layer over a substrate;
    forming through vias over the first redistribution layer;
    attaching a first semiconductor die to the first redistribution layer, the first semiconductor die comprising:
        first connectors on a side of the first semiconductor die opposite the first redistribution layer; and
        a release layer in physical contact with the first connectors;
    encapsulating the release layer and the through vias with an encapsulant;
    polishing the encapsulant;
    forming a second redistribution layer in physical contact with the first connectors and the through vias;
    bonding a second semiconductor die to the second redistribution layer; and
    bonding a package to the second redistribution layer.

2. The method of claim 1, wherein the release layer comprises tetrafluoroethylene (ETFE).

3. The method of claim 1, wherein the first semiconductor die is free from through vias.

4. The method of claim 3, wherein the second semiconductor die is free from through vias.

5. The method of claim 1, wherein the package is part of a wafer-level package assembly.

6. The method of claim 1, wherein the forming the through vias comprises forming stud bumps.

7. The method of claim 6, wherein the forming the through vias comprises a wire bonding process.

8. A method comprising:
    placing an encapsulant over a first redistribution structure, the placing the encapsulant embedding a release layer and through vias in the encapsulant, the release layer being in physical contact with external connections;
    planarizing the encapsulant with the release layer and the through vias;
    connecting a semiconductor die to the through vias with a second redistribution structure; and
    attaching a package to the second redistribution structure, wherein after the attaching the package the semiconductor die is located between the package and the second redistribution structure.

9. The method of claim 8, wherein the release layer comprises polytetrafluoroethylene (PTFE).

10. The method of claim 8, wherein the through vias comprise a lower portion and an upper portion, wherein the lower portion is a bond ball formed in a wire bonding process, and the upper portion is a remaining part of a wire bond used in the wire bonding process.

11. The method of claim 8, wherein the external connections are connected to a die stack.

12. The method of claim 8, wherein the placing the encapsulant comprises at least in part a compression molding process.

13. The method of claim 8, wherein the semiconductor die is a wide input/output (I/O) die.

14. The method of claim 8, wherein the semiconductor die is a die stack.

15. A method comprising:
    forming a first redistribution layer over a substrate;
    forming a first layer over the first redistribution layer, the first layer comprising:
        an encapsulant;
        through vias extending through the encapsulant;
        a semiconductor die extending through the encapsulant, the semiconductor die comprising external connections and a release film, the release film, the through vias, and the encapsulant sharing a coplanar surface;
    forming a second redistribution layer over the first layer;
    connecting a second semiconductor die to the second redistribution layer with first connectors, the first connectors having a first size; and
    connecting a package to the second redistribution layer with second connectors, the second connectors having a second size larger than the first size.

16. The method of claim 15, wherein the package comprises stacked memory dies.

17. The method of claim 15, wherein the package comprises low-power (LP) double data rate (DDR) memory modules.

18. The method of claim 15, wherein the semiconductor die is free from through vias.

19. The method of claim 18, wherein the second semiconductor die is free from through vias.

20. The method of claim 15, wherein the through vias have a pitch of between about 100 μm and about 500 μm.

* * * * *